(12) United States Patent
Yoon et al.

(10) Patent No.: US 8,902,937 B2
(45) Date of Patent: Dec. 2, 2014

(54) COMPACT EXTERNAL CAVITY TUNABLE LASER APPARATUS

(71) Applicant: Electronics and Telecommunications Research Institute, Daejeon (KR)

(72) Inventors: Ki-Hong Yoon, Daejeon (KR); O-Kyun Kwon, Daejeon (KR); Kisoo Kim, Daejeon (KR); Byungseok Choi, Daejeon (KR); Hyun Soo Kim, Daejeon (KR); Su Hwan Oh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/848,247

(22) Filed: Mar. 21, 2013

(65) Prior Publication Data
US 2014/0064306 A1 Mar. 6, 2014

(30) Foreign Application Priority Data
Sep. 4, 2012 (KR) .................. 10-2012-0097573

(51) Int. Cl.
| | |
|---|---|
| *H01S 3/10* | (2006.01) |
| *H01S 5/026* | (2006.01) |
| *H01S 5/14* | (2006.01) |
| H01S 5/022 | (2006.01) |
| H01S 5/00 | (2006.01) |

(52) U.S. Cl.
CPC . *H01S 3/10* (2013.01); *H01S 5/026* (2013.01); *H01S 5/142* (2013.01); *H01S 5/02284* (2013.01); *H01S 5/0265* (2013.01); *H01S 3/10053* (2013.01); *H01S 5/0085* (2013.01); *H01S 5/141* (2013.01)
USPC ............. 372/20; 372/50.11; 372/64; 372/99; 372/102

(58) Field of Classification Search
USPC .......................... 372/20, 50, 64, 99
See application file for complete search history.

(56) References Cited

U.S. PATENT DOCUMENTS

| | | | |
|---|---|---|---|
| 2006/0140228 A1* | 6/2006 | McDonald et al. | ............. 372/20 |
| 2008/0258087 A1* | 10/2008 | Alzner et al. | ................ 250/584 |
| 2008/0285603 A1 | 11/2008 | Mason et al. | |
| 2011/0310918 A1 | 12/2011 | Yoon | |

FOREIGN PATENT DOCUMENTS

JP 2010-177539 A 8/2010

OTHER PUBLICATIONS

K. Mizutani et al "Liquid Crystal Mirror-Based Wavelength-Tunable Laser Module with Asynchronous Mode Cavity", IEEE Photonics Technology Letters, vol. 18, No. 12, Jun. 15, 2006, pp. 1299-1301.
Ki-Hong Yoon et al "Ring-resonator-integrated tunable external cavity laser employing EAM and SOA", Optics Express, vol. 19, No. 25, Dec. 5, 2011, pp. 25465-25470.

\* cited by examiner

*Primary Examiner* — Dung Nguyen
(74) *Attorney, Agent, or Firm* — Rabin & Berdo, P.C.

(57) ABSTRACT

The present disclosure relates to a compact external cavity tunable laser apparatus. The laser apparatus includes a substrate, an external cavity tunable reflecting unit that reflects laser light entering from the outside on the substrate and selects and varies a wavelength of the reflected laser light, an optical fiber that outputs the laser light on the substrate; and an highly integrated light source that integrates the laser light input from the external cavity tunable reflecting unit using inclined input and output waveguides, a curved waveguide, and a straight waveguide to output the integrated laser light to the optical fiber in order to match an optical axis formed with the external cavity tunable reflecting unit with an optical axis formed with an optical fiber.

15 Claims, 2 Drawing Sheets

COMPACT EXTERNAL CAVITY TUNABLE LASER APPARATUS

CROSS-REFERENCE TO RELATED APPLICATIONS

This application is based on and claims priority from Korean Patent Application No. 10-2012-0097573, filed on Sep. 4, 2012, with the Korean Intellectual Property Office, the disclosure of which is incorporated herein in its entirety by reference.

TECHNICAL FIELD

The present disclosure relates to a compact external cavity tunable laser apparatus, and more specifically, to a compact external cavity tunable laser apparatus that is capable of reducing edge reflection at both edges of a highly integrated light source using an inclined waveguide and matching an optical axis formed by the highly integrated light source and a tunable reflecting unit with an optical axis formed by the highly integrated light source and an optical fiber by adding a curved waveguide and a straight waveguide to reduce a size of a laser apparatus and reduce signal distortion caused by a saturated power of an optical amplifying unit.

BACKGROUND

In order to implement a DWDM-PON (dense wavelength division multiplexing passive optical network) optical transport network which is capable of providing a large quantity of communication service, development of a tunable light source which is tunable and modulated at a high speed becomes important.

A representative fast modulation tunable laser among such tunable light sources is a tunable laser that uses a sampled grating distributed Bragg reflector (SG-DBR). Such a SG-DBR tunable laser uses a Vernier effect to extend a tunable range. The SG-DBR tunable laser requires a complex control circuit such as a Vernier control circuit, a wavelength stabilizing optical element and a wavelength stabilizing control circuit, and a phase adjustment control circuit. If the SG-DBR tunable laser uses two ring resonate phase adjusting unit having different free spectral ranges (FSR) instead of using the Bragg grating reflector, the manufacturing process is simple. However, the difference of FSRs between two ring resonate phase adjusting units is small so that complex control may be required for a stable output wavelength.

There is an external cavity tunable laser that uses an external tunable optical element in order to tune an output wavelength of the laser, which is different from the SG-DBR tunable laser and the tunable laser using two ring resonate phase adjusting units which are monolithic integrated tunable lasers. The external cavity tunable laser is manufactured such that a polymer based planar lightwave circuit (PLC) and an optical gain chip are separately manufactured and then the two optical elements are combined to manufacture the tunable laser. The external cavity tunable laser is simply controlled in order to tune the wavelength and has an excellent productivity. The polymer based tunable external cavity laser uses a super luminescent diode (SLD) as an optical gain chip and directly modulates the optical gain chip to have a modulation speed of 2.5 Gbps.

For high speed data transmission at 10 Gbps or higher and long distance data transmission, a tunable laser which is capable of performing high speed modulation is required. An external cavity tunable laser in which a comb reflecting unit is integrated in a light source has a structure in which an optical modulating unit and an optical amplifier are integrated at the output of the laser. Therefore, such an external cavity tunable laser is suitable for the high speed modulation and long distance transmission. Since the external cavity tunable laser uses an external tunable optical element, the external cavity tunable laser may have an excellent productivity and easily control tuning of a wavelength.

The external cavity tunable laser includes a highly integrated light source and a tunable reflecting unit. However, in the external cavity tunable laser, the reflection at both edges of the highly integrated light source may deteriorate the output characteristic of the external cavity tunable laser. Therefore, in order to reduce the reflectance at both edges of the highly integrated light source, the reflectance may be reduced to be approximately 10E-4. For this reason, the external cavity tunable laser generally uses two methods including a method using an inclined waveguide and a non-reflective coating method. The external cavity tunable laser uses the non-reflective coating method to reduce the reflectance. However, it is difficult to obtain sufficiently low reflectance when using only the non-reflective coating method. Therefore, the external cavity tunable laser reduces the reflectance by inclining the output waveguide to form an angle.

However, if the external cavity tunable laser uses the inclined output waveguide in order to reduce the reflectance, an alignment axis between the tunable reflecting unit and the highly integrated light source is different from an alignment axis between an output optical fiber and the highly integrated light source. Accordingly, a width and volume of an external cavity tunable laser apparatus that uses the comb reflecting unit and the ring resonant phase adjusting unit to use a long light source may be increased due to the usage of the inclined waveguide. There is a difficulty in reducing the size of the tunable laser. If the high speed optical signal which is modulated by the optical modulating unit is directly input to the optical amplifier, the optical signal is distorted due to the saturated power of the optical amplifier, which causes problems in the high speed modulation and the long distance transmission. If an optical gain unit and the optical amplifier have the same active layer, a large optical gain and a small optical saturation input power are required. However, it is very hard to manufacture such a highly integrated light source.

SUMMARY

The present disclosure has been made in an effort to provide a compact external cavity tunable laser apparatus which adds a curved waveguide and a straight waveguide between an optical modulating unit and an optical amplifying unit to match an optical axis formed by a highly integrated light source and an external cavity tunable reflecting unit with an optical axis formed by the highly integrated light source and an output optical fiber to thereby reduce the size of the external cavity tunable laser apparatus.

The present disclosure has also been made in an effort to provide a compact external cavity tunable laser apparatus that lowers a power of an optical signal which is input to the optical amplifying unit by a loss by the curved waveguide and the straight waveguide to reduce the signal distortion caused by the saturated power of the optical amplifying unit.

The present disclosure has also been made in an effort to provide a compact external cavity tunable laser apparatus that disposes the curved waveguide and the straight waveguide between the optical modulating unit and the optical amplifying unit so as to prevent an electric interference effect without performing implantation or trench etching which is generally used to prevent the electric interference effect between the optical modulating unit and the optical amplifying unit.

An exemplary embodiment of the present invention provides a compact external cavity tunable laser apparatus including: a substrate; an external cavity tunable reflecting unit that reflects a laser light being inputted from the outside on the substrate and selects and varies a wavelength of the reflected laser light; an optical fiber that outputs the laser light on the substrate; and an highly integrated light source that integrates the laser light input from the external cavity tunable reflecting unit using inclined input and output waveguides, a curved waveguide, and a straight waveguide to match an optical axis of the external cavity tunable reflecting unit with an optical axis of an optical fiber, thereby to output the integrated laser light to the optical fiber in order.

The highly integrated light source may include: an input waveguide that receives the laser light from the external cavity tunable reflecting unit; a phase adjusting unit that adjusts a phase of the input laser light; a gain unit that adjusts a gain of the laser light transmitted from the phase adjusting unit; a comb reflecting unit that reflects the laser light transmitted from the gain unit; curved waveguide and straight waveguide whose radiuses of curvature are adjusted in accordance with a width increased by an inclination of the highly integrated light source so as to match the optical axis formed with the external cavity tunable reflecting unit with the optical axis formed with the optical fiber to transmit the laser light transmitted from the comb reflecting unit; an optical modulating unit that modulates the laser light transmitted through the curved waveguide and the straight waveguide; an optical amplifying unit that amplifies the laser light transmitted from the optical modulating unit; and an output waveguide that outputs the laser light transmitted from the optical amplifying unit.

The comb reflecting unit may include: an optical coupling unit that outputs the laser light transmitted from the gain unit to two output terminals; and a ring resonate phase adjusting unit of which two input terminals are coupled to the two output terminals of the optical coupling unit to reflect the laser light at a predetermined wavelength interval, one of two output terminals outputs the laser light, and the other output terminal outputs a reflective signal.

The highly integrated light source may further include an absorbing unit that absorbs the reflective signal output from the other output terminal of the ring resonate phase adjusting unit.

The highly integrated light source may further includes mode converting units that are provided at the input terminal and the output terminal in order to increase a coupling efficiency by the direct alignment when the direct alignment between the external cavity tunable reflecting unit and the highly integrated light source and the direct alignment between the optical fiber and the highly integrated light source are performed using a support.

The highly integrated light source may further include an optical attenuating unit that is disposed between the optical modulating unit and the optical amplifying unit and lowers an input power of the optical amplifying unit to prevent the signal distortion caused by a saturated power of the optical amplifying unit.

The curved waveguide and the straight waveguide may be disposed between the comb reflecting unit and the optical modulating unit when the highly integrated light source is aligned so as to be inclined and match the optical axis formed with the external cavity tunable reflecting unit with the optical axis formed with the optical fiber.

If a length of the optical modulating unit is longer than a predetermined length, a width of the external cavity tunable laser apparatus may be reduced using the curved waveguide and the straight waveguide which are disposed between the optical modulating unit and the comb reflecting unit having a length which is longer than the predetermined length.

The laser apparatus may further include lenses which are disposed in the input terminal and the output terminal of the highly integrated light source in order to increase the coupling efficiency between the external cavity tunable reflecting unit and the highly integrated light source and the external cavity tunable reflecting unit with the highly integrated light source may be coupled through the lenses.

The external cavity tunable reflecting unit varies the reflective wavelength while reflecting only a predetermined wavelength component like a polymer Bragg grating, a liquid crystal (LC) reflecting unit or a micro electro mechanical systems (MEMS).

The laser apparatus may further include a temperature controller that controls a temperature in order to stabilize a temperature below the highly integrated light source or the external cavity tunable reflecting unit and also stabilize an output characteristic of the laser light.

The laser apparatus may further include an external electrode that includes a plurality of pins and an RF connector or a flexible circuit board electrode.

According to exemplary embodiments of the present disclosure, it is possible to reduce a size of an external cavity tunable laser apparatus by adding a curved waveguide and a straight waveguide between an optical modulating unit and an optical amplifying unit to match an optical axis formed by a highly integrated light source and an external cavity tunable reflecting unit with an optical axis formed by the highly integrated light source and an output optical fiber.

According to exemplary embodiments of the present disclosure, it is possible to lower a power of an optical signal which is input to the optical amplifying unit by a loss by the curved waveguide and the straight waveguide to reduce the signal distortion caused by the saturated power of the optical amplifying unit.

According to exemplary embodiments of the present disclosure, by disposing the curved waveguide and the straight waveguide between the optical modulating unit and the optical amplifying unit, it is possible to prevent an electric interference effect without performing implantation or trench etching which is generally used to prevent the electric interference effect between the optical modulating unit and the optical amplifying unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
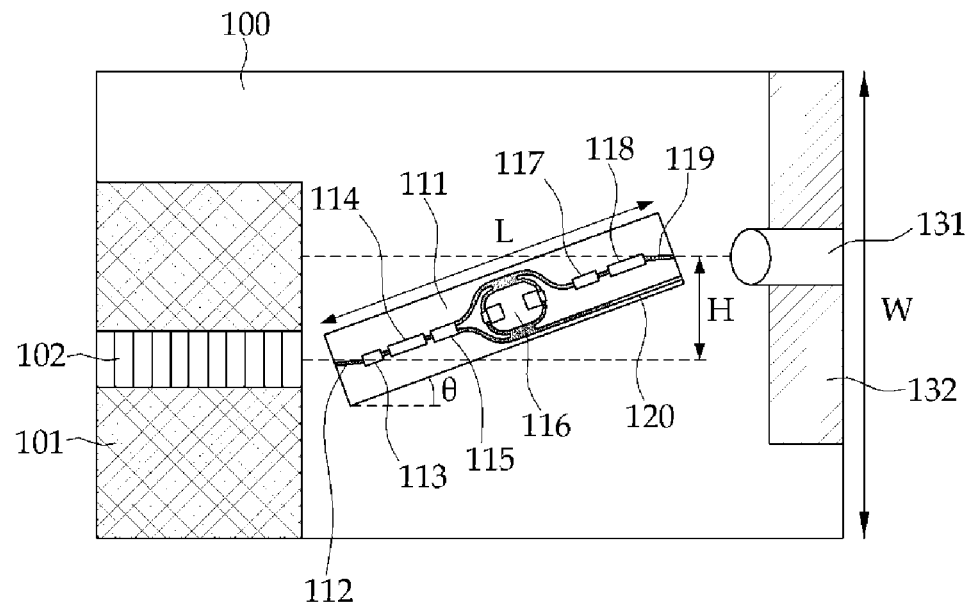
FIG. 1 is a configuration view of an exemplary embodiment of an external cavity tunable laser apparatus in which optical elements are disposed in series in a highly integrated light source.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Hereinafter, exemplary embodiments according to the present disclosure will be described in detail with reference to the accompanying drawings. Configuration of the present disclosure and operation and effects thereof will be apparently understood through the following detailed description. Prior to detailed description of the present disclosure, like reference numerals designate like elements throughout the specification even though the elements are illustrated in different drawings. A detailed explanation of known related functions and constitutions may be omitted when it is determined that the detailed explanation obscures the subject matter of the present disclosure.

FIG. 1 is a configuration view of an exemplary embodiment of an external cavity tunable laser apparatus in which optical elements are disposed in series in a highly integrated light source.

An external cavity tunable laser apparatus 100 is formed on a substrate and includes an external cavity tunable reflecting unit 102, a highly integrated light source 111, and an optical fiber 131. Here, the external cavity tunable reflecting unit 102 may be fixed by a support 101 for fixing the external cavity tunable reflecting unit 102. The optical fiber 131 may be fixed by a support 132 for fixing the optical fiber 131. The highly integrated light source 111 includes an inclined input waveguide 112, a phase adjusting unit 113, a gain unit 114, an optical splitting unit 115, a comb reflecting unit 116, an optical modulating unit 117, an optical amplifying unit 118, an inclined output waveguide 119, and an absorbing unit 120, which are disposed in series. The comb reflecting unit 116 may include two optical coupling units 121 and two or one ring resonate phase adjusting unit 122.

As described above, the optical elements in the highly integrated light source 111 are disposed in series and the input waveguide 112 and the output waveguide 119 of the highly integrated light source 111 are inclined. Therefore, if the highly integrated light source 111 is inclined at a specific angle θ, an optical axis formed by the external cavity tunable reflecting unit 102 and the highly integrated light source 111 is different from an optical axis formed by the optical fiber 131 and the highly integrated light source 111. A width of the external cavity tunable laser apparatus 100 having the inclined output waveguide 119 is larger than a width of an external cavity tunable laser apparatus 100 having a non-inclined output waveguide by H. In other words, the width W of the external cavity tunable laser apparatus 100 is increased by H represented by the following Equation 1.

$$H = L \sin(\theta) \quad \text{[Equation 1]}$$

Here, L indicates a length of the highly integrated light source 111 and θ indicates an inclined angle of the highly integrated light source 111.

For example, if the angle of the inclined waveguide in the highly integrated light source 111 is 7 degrees, the highly integrated light source 111 needs to be inclined approximately at 20 degrees due to the difference in refractive indexes between the highly integrated light source 111 and air. Therefore, if the degree of integration of the highly integrated light source 111 becomes higher or a length of the optical element in the highly integrated light source 111 is increased to increase the length L of the highly integrated light source 111, a width W of the external cavity tunable laser apparatus is significantly increased.

In order to reduce a size of the external cavity tunable laser apparatus 10 of FIG. 1, a compact external cavity tunable laser apparatus according to an exemplary embodiment of the present disclosure will be described with reference to FIGS. 2 and 3.

Figure 2:
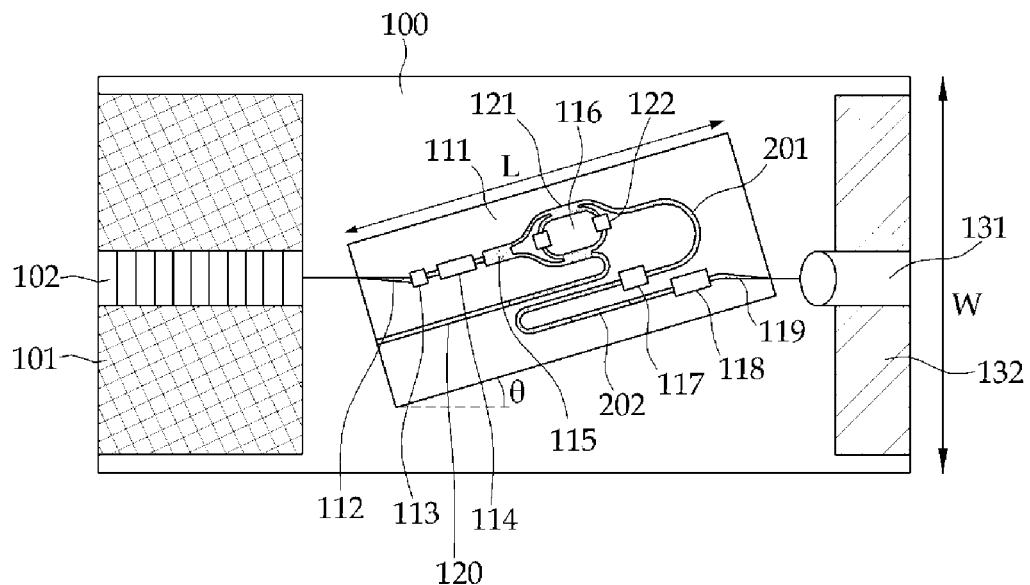
FIG. 2 is a configuration view of a compact external cavity tunable laser apparatus according to an exemplary embodiment of the present disclosure.

FIG. 2 is a configuration view of a compact external cavity tunable laser apparatus according to an exemplary embodiment of the present disclosure.

As illustrated in FIG. 2, the compact external cavity tunable laser apparatus 100 is formed on a substrate and includes an external cavity tunable reflecting unit 102, a highly integrated light source 111, and an optical fiber 131. Here, the external cavity tunable reflecting unit 102 may be fixed by a support 101 for fixing the external cavity tunable reflecting unit 102. The optical fiber 131 may be fixed by a support 132 for fixing the optical fiber 131. The highly integrated light source 111 includes an inclined input waveguide 112, a phase adjusting unit 113, a gain unit 114, an optical splitting unit 115, a comb reflecting unit 116, an optical modulating unit 117, an optical amplifying unit 118, an inclined output waveguide 119, an absorbing unit 120, a curved waveguide and a straight waveguide 201, and an optical attenuating unit 202. The comb reflecting unit 116 may include two optical coupling units 121 and two or one ring resonate phase adjusting unit 122.

Therefore, even though the highly integrated light source 111 is inclined at a specific angle θ, the compact external cavity tunable laser apparatus 100 matches an optical axis formed by the external cavity tunable reflecting unit 102 and the highly integrated light source 111 with an optical axis formed by the optical fiber 131 and the highly integrated light source 111.

Hereinafter, components of the compact external cavity tunable laser apparatus 100 according to the exemplary embodiment of the present disclosure will be described.

The external cavity tunable reflecting unit 102 reflects laser light entering from the outside on the substrate and selects and varies a wavelength of the reflected laser light. All types of reflectors which can vary the reflective wavelength while reflecting only a predetermined wavelength component, such as a polymer Bragg grating, a liquid crystal (LC) reflecting unit, or micro electro mechanical systems (MEMS) may be used as the external cavity tunable reflecting unit 102. The external cavity tunable reflecting unit 102 is not limited to a specific type of reflector.

The highly integrated light source 111 integrates the laser light input from the external cavity tunable reflecting unit 102 using the inclined input and output waveguides 112 and 119, and the curved waveguide and straight waveguide 201 to output the integrated laser light to the optical fiber 131 in order to match an optical axis formed with the external cavity tunable reflecting unit 102 with an optical axis formed with the optical fiber 131.

The optical fiber 131 outputs the laser light transmitted from the highly integrated light source 111 on the substrate.

When the highly integrated light source 111 is specifically described, the inclined input waveguide 112 receives the laser light from the external cavity tunable reflecting unit.

The phase adjusting unit 113 adjusts a phase of the laser light input from the input waveguide 112.

The gain unit 114 adjusts a gain of the laser light transmitted from the phase adjusting unit 113.

The optical splitting unit 115 splits the laser light transmitted from the gain unit 114.

The comb reflecting unit 116 reflects the laser light which is split from the optical splitting unit 115. When the comb reflecting unit 116 is specifically described, the optical coupling unit 121 of the comb reflecting unit 116 outputs the laser light transmitted from the gain unit 114 to two output terminals. Two input terminals of the ring resonate phase adjusting unit 122 are coupled two output terminals of the optical coupling units 121, respectively to reflect the laser light at a predetermined wavelength interval. Here, the ring resonate phase adjusting unit 122 outputs the laser light to one output terminal among the two output terminals and outputs the reflective signal to the other terminal.

The curved waveguide and straight waveguide 201 adjusts a radius of curvature in accordance with a width H increased by an inclination θ of the highly integrated light source 111 so as to match the optical axis formed with the external cavity tunable reflecting unit 102 with the optical axis formed with the optical fiber 131 to thereby transmit the laser light transmitted from the comb reflecting unit 116. When the highly integrated light source 111 is aligned so as to be inclined, the curved waveguide and straight waveguide 201 are disposed between the comb reflecting unit 116 and the optical modulating unit 117 and match the optical axis formed with the external cavity tunable reflecting unit 102 with the optical axis formed with the optical fiber 131.

The optical modulating unit 117 modulates the laser light transmitted through the curved waveguide and straight waveguide 201. If a length of the optical modulating unit 117 is longer than a predetermined length, a width W of the external cavity tunable laser apparatus 100 may be reduced using the curved waveguide and straight waveguide 201 which are disposed between the comb reflecting unit 116 having a length which is longer than the predetermined length and the optical modulating unit 117.

The optical amplifying unit 118 amplifies the laser light transmitted from the optical modulating unit 117.

The inclined output waveguide 119 outputs the laser light transmitted from the optical amplifying unit 118.

The absorbing unit 120 absorbs the reflective signal output from the other output terminal of the ring resonate phase adjusting unit 122.

The optical attenuating unit 202 is disposed between the optical modulating unit 117 and the optical amplifying unit 118 and lowers an input power of the optical amplifying unit 118 to prevent the signal distortion caused by a saturated power of the optical amplifying unit 118.

As described above, the compact external cavity tunable laser apparatus 100 additionally includes the curved waveguide and straight waveguide 201 between the comb reflecting unit 116 and the optical amplifying unit 118 so as to match the optical axis formed by the highly integrated light source 111 and the external cavity tunable reflecting unit 102 with the optical axis formed by the highly integrated light source 111 and the output optical fiber 131. Accordingly, the compact external cavity tunable laser apparatus 100 may be implemented with a reduced size and a power of the optical signal which is input to the optical amplifying unit 118 is lowered through the loss by the curved waveguide and straight waveguide 201 to reduce the signal distortion caused by the saturated power of the optical amplifying unit 118. The curved waveguide and straight waveguide 201 are disposed between the optical modulating unit 117 and the optical amplifying unit 118 so that implantation or trench etching which is generally used to prevent the electric interference effect between the optical modulating unit 117 and the optical amplifying unit 118 is not required.

As described above, if the curved waveguide and straight waveguide 201 are added to the highly integrated light source 111, a length L of the highly integrated light source 111 is reduced but a width of the highly integrated light source 111 is increased. However, a width of the support 101 that fixes the external cavity tunable reflecting unit 102 and a width of the support 132 that fixes the optical fiber 131 are larger than a width of the highly integrated light source 111 so that the increase in the width of the highly integrated light source does not affect the increase in the width of the external cavity tunable laser apparatus 100. Therefore, if the optical axes of the external cavity tunable reflecting unit 102, the highly integrated light source 111, and the optical fiber 131 are matched using the curved waveguide and straight waveguide 201, the external cavity tunable laser apparatus 100 may be small sized and easily manufactured.

The optical loss generated by the curved waveguide and straight waveguide 201 is compensated by the optical amplifying unit 118 of the highly integrated light source 111. However, if the gain unit 114 and the optical amplifying unit 118 have the same active region in order to simplify the manufacturing of the highly integrated light source 111, the saturated power of the optical amplifying unit 118 is lowered. Therefore, if the output power of the optical signal which is modulated in the optical modulating unit 117 is high, the modulated optical signal is distorted. In order to prevent the signal distortion, the highly integrated light source 111 may further include an optical attenuating unit 202 between the optical modulating unit 117 and the optical amplifying unit 118. Therefore, the curved waveguide and straight waveguide 201 may reduce the signal distortion caused by the low saturated power of the optical amplifying unit 118.

The optical modulating unit 117 having a length which is larger than the predetermined length as described above will be described. As an example, a Mach-Zehnder optical modulating unit is an optical modulating unit having a length which is larger than the predetermined length and modulates an optical signal using change in a refractive index by photoelectric effect. The Mach-Zehnder optical modulating unit enables longer transmission and has lower wavelength dependency as compared with an electro-absorption modulator (EAM). Therefore, the Mach-Zehnder optical modulating unit is suitable for an optical modulating unit for the tunable laser. However, since the change in the refractive index of the highly integrated light source 111 is small, a long Mach-Zehnder optical modulating unit is preferable.

Therefore, as illustrated in FIG. 1, if the optical elements in the highly integrated optical source 111 are configured in series, the length of the highly integrated light source 111 is increased. Therefore, the size of the compact external cavity tunable laser apparatus 100 is increased. In contrast, in the added curved waveguide and straight waveguide 201, since the length of the straight waveguide 201 is sufficiently increased, the Mach-Zehnder optical modulating unit may be used as the optical modulating unit 117. In other words, by using the curved waveguide and straight waveguide 201, even when as the optical modulating unit 117, not only the EAM, but also the Mach-Zehnder optical modulating unit having a length which is larger than a predetermined length is used, the size of the compact external cavity tunable laser apparatus 100 is not affected.

In the meantime, as the distance between the optical modulating unit 117 and the gain unit 114 or the optical amplifying unit 118 becomes larger, the electric interference generated between the optical modulating unit 117 and the optical gain unit 114 or the optical amplifying unit 118 becomes smaller. When the distance is shorter, in order to prevent the electric interference, the implantation is used or a trench is etched. If the length of the curved waveguide and straight waveguide 201 is disposed between the optical modulating unit 117 and the optical amplifying unit 118, the electric interference is small so that the implantation or trench etching is not required.

In the meantime, the compact external cavity tunable laser apparatus 100 illustrated in FIG. 2 uses a method that directly aligns the external cavity tunable reflecting unit 102 and the highly integrated light source 111 and the optical fiber 131 and the highly integrated light source 111 using the supports 101 and 132. If the direct alignment is used, the entire resonance length of the external cavity tunable laser becomes short. However, in this case, the alignment error is large, which may lower a coupling efficiency.

Therefore, the highly integrated light source 111 may further include a mode converting unit (spot size converter) which is disposed at the input terminal and the output terminal in order to increase the coupling efficiency by the direct alignment when the alignment between the external cavity tunable reflecting unit 102 and the highly integrated light source 111 and the alignment between the optical fiber 131 and the highly integrated light source 111 are directly performed using the supports 101 and 132. If an output mode size of the external cavity tunable reflecting unit 102 is different from an output mode size of the highly integrated light source 111, the coupling efficiency is lowered so that the laser output characteristic is deteriorated. Therefore, the compact external cavity tunable laser apparatus 100 may improve the laser output characteristic by increasing the coupling efficiency between the external cavity tunable reflecting unit 102 and the highly integrated light source 111 using the inclined input waveguide 112 of the highly integrated light source 111 together with the mode converting unit. The compact external cavity tunable laser apparatus 100 uses the inclined waveguide 119 of the highly integrated light source 111 together with the mode converting unit to make the mode size of the optical fiber 131 and the mode size of the highly integrated light source 111 be equal to each other, thereby increasing an output power of the laser.

The compact external cavity tunable laser apparatus 100 may further include a temperature controller that controls a temperature in order to stabilize a temperature below the highly integrated light source 111 or the external cavity tunable reflecting unit 102 and also stabilize an output characteristic of the laser light. In other words, the compact external cavity tunable laser apparatus 100 may include the temperature controller that controls a temperature to stabilize the temperature and the output characteristic of the highly integrated light source 111. The compact external cavity tunable laser apparatus 100 may further include a temperature controller below the external cavity tunable reflecting unit 102 in order to stabilize an output of the laser light. One temperature controller is used to control the temperature of the highly integrated light source 111 and the external cavity tunable reflecting unit 102 or two temperature controllers are used to control the temperature of the highly integrated light source 111 and the external cavity tunable reflecting unit 102, respectively.

The compact external cavity tunable laser apparatus 100 needs to be applied with electricity in order to control the highly integrated light source 111 and the external cavity tunable reflecting unit 102. The compact external cavity tunable laser apparatus 100 may further include an external electrode that includes a plurality of pins and an RF connector, or a flexible circuit board electrode. The electricity is supplied through the external electrode which includes a plurality of pins and an RF connector or an flexible circuit board electrode. If the electrode is formed using the flexible circuit board, the volume of the compact external cavity tunable laser apparatus 100 which is increased by forming electrodes is reduced so as to reduce the size of the compact external cavity tunable laser apparatus 100.

Figure 3:
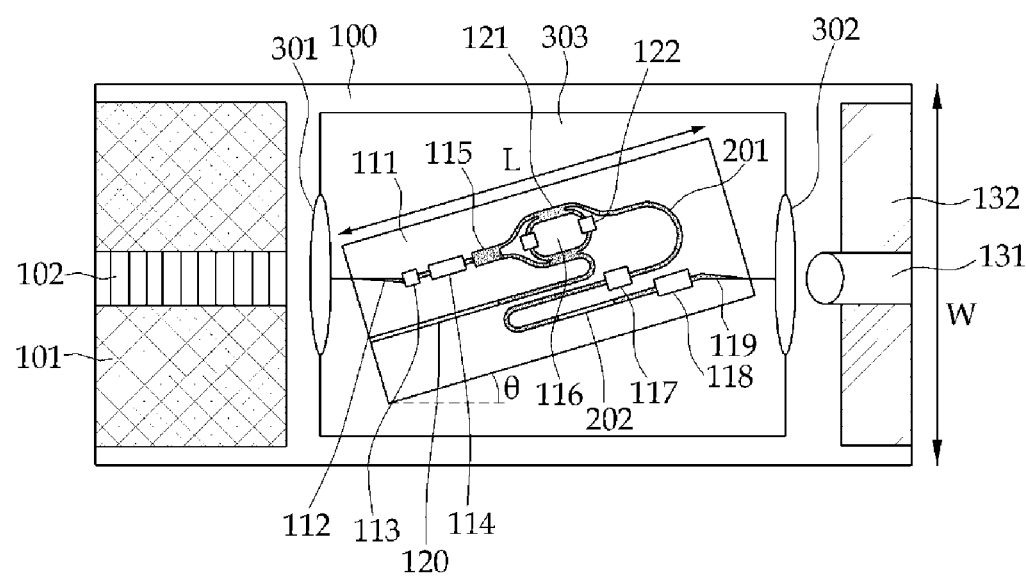
FIG. 3 is a configuration view of a compact external cavity tunable laser apparatus that uses a lens according to an exemplary embodiment of the present disclosure.

FIG. 3 is a configuration view of a compact external cavity tunable laser apparatus that uses a lens according to an exemplary embodiment of the present disclosure.

As illustrated in FIG. 3, the compact external cavity tunable laser apparatus 100 is formed on the substrate and includes an external cavity tunable reflecting unit 102, a highly integrated light source 111, and an optical fiber 131. The compact external cavity tunable laser apparatus 100 further includes lenses 301 and 302 and a lens support 303 at an input terminal and an output terminal of the highly integrated light source 111. Here, one lens 301 of the lenses 301 and 302 is disposed between the external cavity tunable reflecting unit 102 and the highly integrated light source 111 and the other lens 302 is disposed between the highly integrated light source 111 and the optical fiber 131. In other words, the lenses 301 and 302 are disposed at the input terminal and the output terminal of the highly integrated light source 111.

Even when the highly integrated light source 111 is inclined, the lenses 301 and 302 are disposed so as to match the optical axis formed by the external cavity tunable reflecting unit 102 and the highly integrated light source 111 with the optical axis formed by the optical fiber 131 and the highly integrated light source 111 so that the coupling efficiency is improved. After mounting the lenses 301 and 302 to both the input terminal and the output terminal of the highly integrated light source 111, if the external cavity tunable reflecting unit 102 and the optical fiber 131 are aligned, the optical axes become parallel. This is to easily align the optical axes and reduce the lowering of the optical output by the alignment deviation. As described above, the lenses 301 and 302 reduce the alignment error and increase the optical coupling efficiency to facilitate the coupling at the time of implementing the external cavity tunable laser apparatus 100. The highly integrated light source 111 may further include a mode converting unit (spot size converter) in order to increase the coupling efficiency by the alignment.

According to an exemplary embodiment of the present disclosure, it is possible to reduce edge reflection using an inclined waveguide at both edges of a highly integrated light source and reduce a size of a laser apparatus and lower the signal distortion caused by the saturated power of the optical amplifying unit by adding a curved waveguide and a straight waveguide to match an optical axis formed by the highly integrated light source and a tunable reflecting unit with an optical axis formed by the highly integrated light source and an optical fiber. As described above, the present disclosure surpasses the limitation of the related art so as to not only have a sufficient possibility of being marketed or business of the device to which the present disclosure is used or applied but also to be apparently embodied practically. Therefore, the present disclosure has industrial applicability.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A compact external cavity tunable laser apparatus, comprising:
a substrate;
an external cavity tunable reflecting unit disposed on the substrate and that reflects a laser light being inputted from outside the external cavity tunable reflecting unit, the external cavity tunable reflecting unit selecting and varying a wavelength of the reflected laser light;
an optical fiber that outputs the reflected laser light and being disposed on the substrate; and
a highly integrated light source that has an inclined input waveguide, an inclined output waveguide, a curved waveguide, and a straight waveguide, the highly integrated light source receiving and integrating the reflected laser light, that is input from the external cavity tunable reflecting unit, using the input, the output, the curved and the straight waveguides, to match an optical axis of the external cavity tunable reflecting unit with an optical axis of the optical fiber, thereby to output the integrated laser light to the optical fiber, the curved waveguide having first and second ends, the first and second ends facing in a same direction.

2. The compact external cavity tunable laser apparatus of claim 1, further comprising:
lenses which are provided in input and output terminals of the highly integrated light source in order to increase a coupling efficiency between the external cavity tunable reflecting unit and the highly integrated light source,
wherein the external cavity tunable reflecting unit and the highly integrated light source are coupled through the lenses.

3. The compact external cavity tunable laser apparatus of claim 1,
wherein the external cavity tunable reflecting unit varies a reflective wavelength while reflecting only a predetermined wavelength component, the external cavity tunable reflecting unit being a polymer Bragg grating, a liquid crystal (LC) reflecting unit, or a micro electro mechanical systems (MEMS).

4. The compact external cavity tunable laser apparatus of claim 1, further comprising:
a temperature controller that controls a temperature in order to stabilize a temperature of an area below the highly integrated light source or the external cavity tunable reflecting unit and also stabilize an output characteristic of the laser light outputted from the highly integrated light source or the external cavity tunable reflecting unit.

5. The compact external cavity tunable laser apparatus of claim 1, further comprising:
an external electrode that includes
a plurality of pins and an RF connector, or
a flexible circuit board electrode.

6. The compact external cavity tunable laser apparatus of claim 1, wherein the laser light in the curved waveguide propagates in both
a first direction away from the external cavity tunable reflecting unit, and
a second direction toward the external cavity tunable reflecting unit.

7. The compact external cavity tunable laser apparatus of claim 1, wherein the highly integrated light source includes:
a comb reflecting unit that reflects and transmits the laser light; and
an optical modulating unit that modulates the laser light transmitted through the curved waveguide, and
wherein the curved waveguide is disposed between the comb reflecting unit and the optical modulating unit.

8. A compact external cavity tunable laser apparatus, comprising:
a substrate;
an external cavity tunable reflecting unit disposed on the substrate and that reflects a laser light being inputted from outside the external cavity tunable reflecting unit, the external cavity tunable reflecting unit selecting and varying a wavelength of the reflected laser light;
an optical fiber that outputs the reflected laser light and being disposed on the substrate; and
a highly integrated light source that has an inclined input waveguide, an inclined output waveguide, a curved waveguide, and a straight waveguide, the highly integrated light source integrating the reflected laser light, that is input from the external cavity tunable reflecting unit, using the input, the output, the curved and the straight waveguides, to match an optical axis of the external cavity tunable reflecting unit with an optical axis of the optical fiber, thereby to output the integrated laser light to the optical fiber, the input waveguide receiving the reflected laser light from the external cavity tunable reflecting unit, and the highly integrated light source further includes:
a phase adjusting unit that adjusts a phase of the input laser light that is input from the external cavity tunable reflecting unit and transmits the laser light having the adjusted phase;
a gain unit that adjusts a gain of the laser light transmitted from the phase adjusting unit, the gain unit transmitting the laser light having the adjusted gain;
a comb reflecting unit that reflects and transmits the laser light transmitted from the gain unit,
wherein the curved waveguide and the straight waveguide have radiuses of curvature that are adjusted in accordance with a width of the compact external cavity tunable laser apparatus that is increased by an inclination of the highly integrated light source so as to match the optical axis formed by the external cavity tunable reflecting unit with the optical axis formed by the optical fiber to transmit the laser light transmitted from the comb reflecting unit; and
an optical modulating unit that modulates and transmits the laser light transmitted through the curved waveguide and the straight waveguide; and
an optical amplifying unit that amplifies and transmits the laser light transmitted from the optical modulating unit,
wherein the output waveguide outputs the laser light transmitted from the optical amplifying unit.

9. The compact external cavity tunable laser apparatus of claim 8,
wherein the comb reflecting unit includes:
an optical coupling unit that outputs the laser light transmitted from the gain unit to two output terminals of the optical coupling unit; and
a ring resonate phase adjusting unit of which two input terminals are coupled to the two output terminals of the optical coupling unit to reflect the laser light from the optical coupling unit at a predetermined wavelength interval, one of two output terminals of the ring resonate phase adjusting unit outputs the laser light, and the other output terminal of the two output terminals of the ring resonate phase adjusting unit outputs a reflective signal.

10. The compact external cavity tunable laser apparatus of claim 9,
wherein the highly integrated light source further includes an absorbing unit that absorbs the reflective signal output from the other output terminal of the ring resonate phase adjusting unit.

11. The compact external cavity tunable laser apparatus of claim 8, further comprising supports, and
wherein the highly integrated light source further includes mode converting units that are provided at an input terminal of the highly integrated light source and an output terminal of the highly integrated light source in order to increase a coupling efficiency by a direct alignment, the direct alignment being
between the external cavity tunable reflecting unit and the highly integrated light source using one of the supports, and
between the optical fiber and the highly integrated light source using another of the supports.

12. The compact external cavity tunable laser apparatus of claim 8,
wherein the highly integrated light source further includes an optical attenuating unit that is disposed between the optical modulating unit and the optical amplifying unit and lowers an input power of the optical amplifying unit to prevent signal distortion caused by a saturated power of the optical amplifying unit.

13. The compact external cavity tunable laser apparatus of claim 8,
wherein when the highly integrated light source is aligned so as to be inclined, the curved waveguide and the straight waveguide are disposed between the comb reflecting unit and the optical modulating unit and match the optical axis formed by the external cavity tunable reflecting unit with the optical axis formed by the optical fiber.

14. The compact external cavity tunable laser apparatus of claim 13,
wherein if a length of the optical modulating unit is longer than a predetermined length, a width of the external cavity tunable laser apparatus is reduced using the curved waveguide and the straight waveguide which are disposed between the optical modulating unit and the comb reflecting unit having a length which is longer than the predetermined length.

15. A compact external cavity tunable laser apparatus, comprising:
a substrate;
an external cavity tunable reflecting unit disposed on the substrate and that reflects a laser light being inputted from outside the external cavity tunable reflecting unit, the external cavity tunable reflecting unit selecting and varying a wavelength of the reflected laser light;
an optical fiber that outputs the reflected laser light and being disposed on the substrate; and
a highly integrated light source that has an inclined input waveguide, an inclined output waveguide, a curved waveguide, and a straight waveguide, the highly integrated light source receiving and integrating the reflected laser light, that is input from the external cavity tunable reflecting unit, using the input, the output, the curved and the straight waveguides, to match an optical axis of the external cavity tunable reflecting unit with an optical axis of the optical fiber, thereby to output the integrated laser light to the optical fiber, the input waveguide receiving the laser light from the external cavity tunable reflecting unit, and the highly integrated light source further includes:
a comb reflecting unit that reflects and transmits the laser light; and
an optical modulating unit that modulates the laser light transmitted through the curved waveguide, and
wherein the curved waveguide is disposed between the comb reflecting unit and the optical modulating unit.

* * * * *